(12) United States Patent
Ding (10) Patent No.: US 9,479,181 B1
(45) Date of Patent: Oct. 25, 2016

(54) REFERENCE CLOCK ARCHITECTURE FOR INTEGRATED CIRCUIT DEVICE

(71) Applicant: Altera Corporation, San Jose, CA (US)

(72) Inventor: Weiqi Ding, Fremont, CA (US)

(73) Assignee: Altera Corporation, San Jose, CA (US)

( * ) Notice: Subject to any disclaimer, the term of this patent is extended or adjusted under 35 U.S.C. 154(b) by 158 days.

(21) Appl. No.: 14/339,722

(22) Filed: Jul. 24, 2014

(51) Int. Cl.
*H03L 7/06* (2006.01)
*H03L 7/08* (2006.01)

(52) U.S. Cl.
CPC .. *H03L 7/08* (2013.01); *H03L 7/06* (2013.01)

(58) Field of Classification Search
CPC ....................................................... H03L 7/08
USPC ......................................................... 327/147
See application file for complete search history.

(56) References Cited

U.S. PATENT DOCUMENTS

| | | | | |
|---|---|---|---|---|
| 7,742,553 B1 * | 6/2010 | Bataineh | ............... | H03C 3/0991 327/147 |
| 2006/0008041 A1 * | 1/2006 | Kim | ..................... | H03L 7/0812 375/371 |
| 2010/0232558 A1 * | 9/2010 | Terada | .................. | H03L 7/0805 375/374 |
| 2011/0008053 A1 * | 1/2011 | Nguyen | ........... | H04B 10/07953 398/115 |
| 2014/0098843 A1 * | 4/2014 | Kong | ................ | G01R 31/31709 375/219 |
| 2014/0270004 A1 * | 9/2014 | Christensen | .......... | H04L 27/152 375/327 |

OTHER PUBLICATIONS

Geng, S., et al., "A PLL/DLL Based CDR with $\Delta\Sigma$ Frequency Tracking and Low Algorithmic Jitter Generation,"*2013 IEEE International Symposium on Circuits and Systems (ISCAS)*, pp. 1179-1182, May 19-23, 2013.

* cited by examiner

*Primary Examiner* — Ryan Jager
(74) *Attorney, Agent, or Firm* — Fletcher Yoder PC (57) ABSTRACT

A clocking arrangement for transceivers in an integrated circuit device includes a plurality of fractionally adjustable phase-locked loops. Each respective one of the fractionally adjustable phase-locked loops generates a respective transmit frequency for a respective one of the transceivers. There is a respective clock-data recovery module in a receive portion of each respective one of the transceivers, and each respective clock-data recovery module includes a respective fractionally adjustable frequency-lock loop. There is a reference clock input providing a reference clock for a plurality of the fractionally adjustable phase-locked loops and the fractionally adjustable frequency-lock loops. The reference clock input can be a sole reference clock input providing a reference clock for all of the adjustable phase-locked frequency-lock loops. Alternatively, the reference clock input can include a plurality of separate reference clock inputs, each providing a separate reference clock to a predetermined subset of the adjustable phase-locked or frequency-lock loops.

25 Claims, 5 Drawing Sheets

REFERENCE CLOCK ARCHITECTURE FOR INTEGRATED CIRCUIT DEVICE

BACKGROUND OF THE INVENTION

This invention relates to a reference clock architecture for an integrated circuit device, and particularly for types of integrated circuit devices, such as programmable devices, where a user may specify a clock rate.

Certain types of integrated circuit devices allow users to specify various settings, such as clock rates. In particular, programmable devices, including, for example, programmable logic devices such as field-programmable gate arrays (FPGAs), may allow a user to specify a complete logic configuration, various portions of which may require different clock rates, none of which are known with any certainty at the time of device manufacture. Such devices have been manufactured with circuitry to allow various clock rates to be selected by the user, which may have resulted in overly complex clock networks, including many components that may never be used by a particular user.

For example, such devices may incorporate high-speed serial interfaces to accommodate high-speed (i.e., greater than 1 Gbps) serial I/O standards. Because there are multiple different standards, which may operate at multiple different rates, and because a user may elect to use more than one standard and/or rate, the ability to provide multiple reference clocks may be desirable. Heretofore, this has required the provision of multiple reference clock sources such as phase-locked loops (PLLs) or delay-locked loops (DLLs), with a clock network capable of routing a reference clock signal from any one of those sources to any one of a number of interface circuits.

SUMMARY OF THE INVENTION

The present invention reduces the complexity of reference clocking in integrated circuit devices of a type in which a user can specify one or more clock rates after a device has been manufactured. This is accomplished by providing a finely-adjustable reference clock source in place of multiple separate reference clock sources. That reduces not only the number of reference clock sources, but also the complexity of the reference clock network, because it is no longer necessary to be able to route any of a plurality of different reference clock outputs to any of a plurality of circuits that use those outputs. Rather, a small number of reference clock sources—even a single reference clock source—can generate the needed reference clock outputs, and the reference clock network need only route the outputs of the small number of reference clock sources to the circuits that use those outputs.

One of the types of circuits that uses the output of the reference clock source is clock-data recovery (CDR) circuitry in a serial interface. Certain types of CDR circuitry may use a "dual-loop" architecture in which a frequency-lock loop is used to get close to the target clock, and then a data-lock loop is used to extract the actual clock. In such an architecture, each frequency-lock loop itself includes a reference clock source. Embodiments of the present invention further reduce reference clocking complexity by providing finely-adjustable reference clock sources for CDR frequency-lock loops, thereby reducing the number of different clock sources needed for CDR modules on a device.

According to embodiments of the invention, whether for the reference clock sources for the reference clock network, or the reference clock sources for the CDR modules, the finely-adjustable reference clock sources may be provided using fractional phase-locked loops. In a fractional PLL, the feedback divider/counter, rather than being an adjustable integer counter, is a fractional counter, adjustable in small increments to almost any value that a user may require. For example, the resolution may be as fine as one part-per-million.

Thus, in accordance with the present invention, there is provided a clocking arrangement for transceivers in an integrated circuit device. The clocking arrangement includes a plurality of fractionally adjustable phase-locked loops, each respective one of the fractionally adjustable phase-locked loops being for generating a respective transmit frequency for a respective one of the transceivers. There is a respective clock-data recovery module in a receive portion of each respective one of the transceivers, and each respective clock-data recovery module includes a respective fractionally adjustable frequency-lock loop. There is a reference clock input providing a reference clock for a plurality of the fractionally adjustable phase-locked loops and the fractionally adjustable frequency-lock loops.

The reference clock input can be a sole reference clock input that provides a reference clock for all of the adjustable phase-locked loops and the adjustable frequency-lock loops. In that case, a single reference clock conductor can conduct the reference clock from the single reference clock input to all of the adjustable phase-locked loops and adjustable frequency-lock loops.

Alternatively, the reference clock input can include a plurality of separate reference clock inputs, each of which provides a separate reference clock to a predetermined subset of the adjustable phase-locked loops and the adjustable frequency-lock loops. In that case, there may be a reference clock bus including a respective separate reference clock conductor for conducting each of the separate reference clocks from a respective one of the separate reference clock inputs directly to a respective predetermined subset of the adjustable phase-locked loops and the adjustable frequency-lock loops.

The predetermined subset of the adjustable phase-locked loops and the adjustable frequency-lock loops may include only adjustable phase-locked loops, and may include all or fewer than all of the adjustable phase-locked loops. Alternatively, the predetermined subset of the adjustable phase-locked loops and the adjustable frequency-lock loops may include only adjustable frequency-lock loops, and may include all of the adjustable frequency-lock loops.

An integrated circuit device incorporating such a clocking arrangement, and a method of operating such an integrated circuit device, also are provided.

BRIEF DESCRIPTION OF THE DRAWINGS

Further features and advantages of the invention will be apparent upon consideration of the following detailed description, taken in conjunction with the accompanying drawings, in which like reference characters refer to like parts throughout, and in which.

DETAILED DESCRIPTION OF THE INVENTION

There are many different high-speed serial interface protocols running at different data rates, including, for example and without limitation, PCI Express (PCIe), 10 Gigabit Ethernet (10GE), 10 Gigabit Attachment Unit Interface (XAUI), Serial AT Attachment (SATA), Fibre Channel (FC), and Common Public Radio Interface (CPRI). If an integrated circuit device is to support all, or a large number, of these standards, without knowing in advance which standard a user may want to use, then the device should be able to provide reference clock sources at the data rate of any of these standards. And such reference clocks would be needed both for the transmit portion of any serial interface based on such standard, and for clock-data recovery in the receive portion of such an interface (where, as is frequently the case, the serial communication is asynchronous and no separate clock signal is transmitted).

A user of such a device may choose any of the foregoing protocols, or other protocols, depending on the needs of the user's application. For ease of discussion, embodiments of the invention will be discussed in connection with programmable logic devices (PLDs) such as FPGAs. It should be understood, however, that the invention also may be embodied in other types of devices having user-configurable or user-programmable transceiver interfaces, whether the remainder of the device is fixed or programmable.

Figure 1:
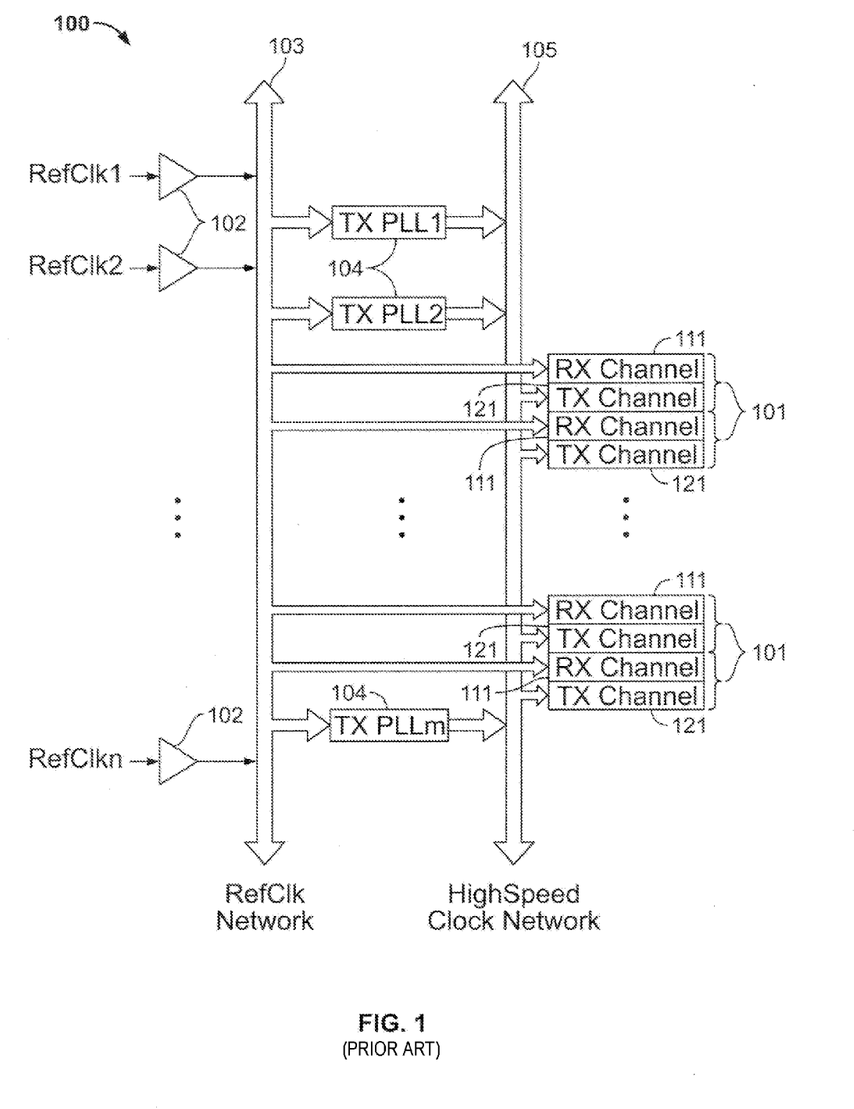
FIG. 1 shows a known configurable transceiver arrangement.

FIG. 1 shows a portion of a known transceiver arrangement 100 that may be provided with a PLD, either on the same die, or on one or more separate dice that are wire-bonded or otherwise connected (e.g., via a bump array) to the PLD die. Transceiver arrangement 100 includes a plurality of transceivers 101, each including a receive (RX) channel 111 and a transmit (TX) channel 121. A plurality of input reference clock buffers 102 (three shown explicitly) allow a user to input to transceiver arrangement 100 whatever reference clocks may be needed for the user's particular design.

Any input clocks that may be applied to reference clock buffers 102 are then applied by reference clock buffers 102 to reference clock network 103. Reference clock network 103 includes sufficient conductors (not shown) to route as many input reference clocks as may be applied to reference clock buffers 102 to any destination that a user may select. Generally, that means that the number of conductors in reference clock network 103 is at least equal to the number of reference clock buffers 102. Moreover, because reference clock network 103 should be able to conduct the input reference clocks to any portion of the device at which a high-speed serial interface may be located, those conductors are likely to be long, and, to prevent signal degradation, they are likely to be relatively wider, and spaced relatively further apart, than most conductors on the device that do not have to convey signals as far. In addition, routing resources to allow selective routing according to a user design also are included in reference clock network 103. It will be appreciated, then, that reference clock network 103 consumes a relatively larger portion of device resources, as well as power, than some other portions of the device.

In particular, each receive channel 111 includes a PLL as part of the frequency-lock loop of its CDR circuitry. Therefore, the relevant input reference clock has to be able to be routed to a corresponding receive channel 111.

Similarly, a plurality of transmit PLLs 104 (three shown explicitly) also are provided, to generate transmit frequencies for transmit channels 121. Again, because each transmit channel 121 may transmit on its own respective frequency, the number of transmit PLLs 104 may be at least as great as the number of transmit channels 121, although embodiments in which multiple transmit channels use the same frequency are also possible, in which case the number of transmit PLLs 104 could be less than the number of transmit channels 121. On the other hand, in order to offer users the required flexibility in choosing a transmit frequency, the number of transmit PLLs 104 could be higher than the number of transmit channels 121 even if re-use were possible.

Further resources are consumed by high-speed clock network 105, which routes the output of each transmit PLL 104 that is in use to the corresponding transmit channel or channels 121. High-speed clock network 105 shares many characteristics of reference clock network 103, including its consumption of resources and power.

Figure 2:
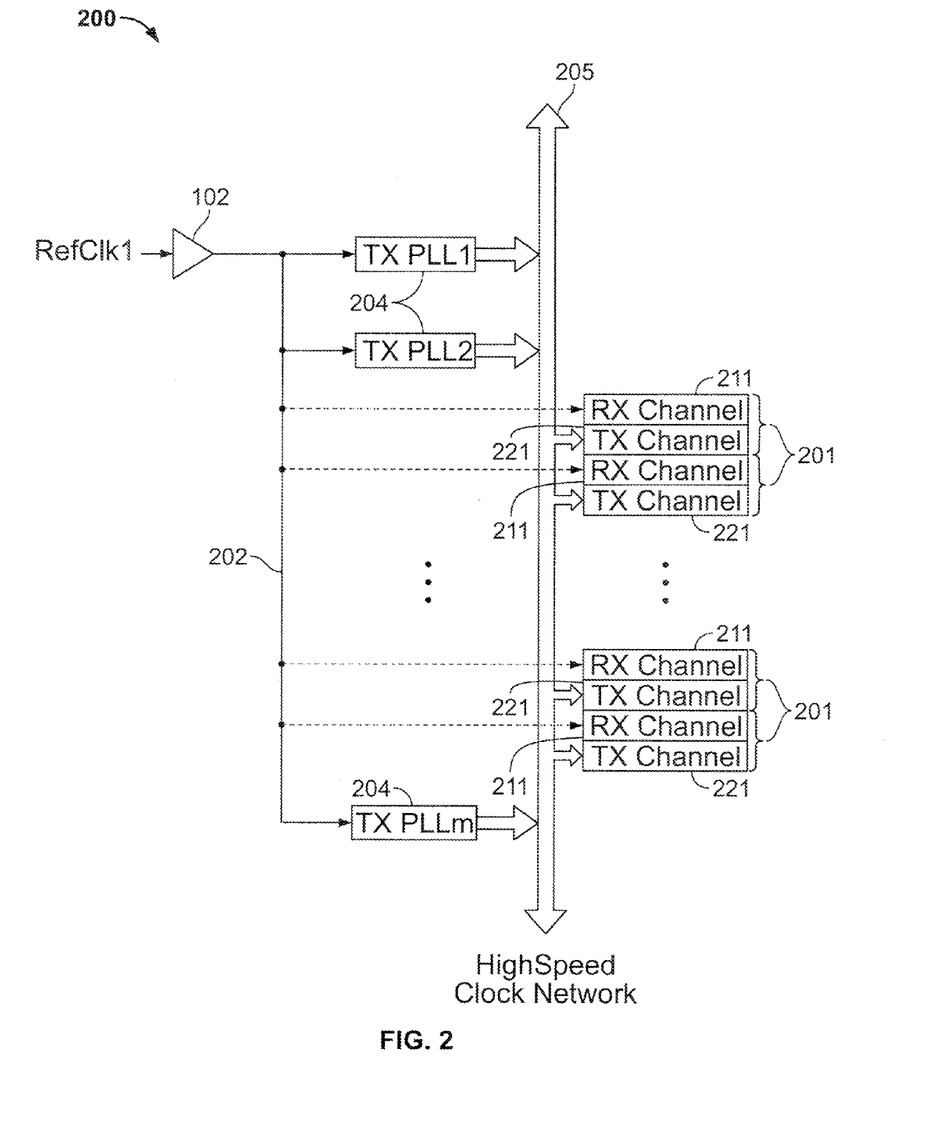
FIG. 2 shows a configurable transceiver arrangement according to embodiments of the present invention.

FIG. 2 shows an implementation 200 of an embodiment of the present invention, illustrating how reference clock network 103 may be eliminated, thereby conserving resources and power. In implementation 200, each transmit PLL 204 is a fractional PLL. That may not reduce the number of transmit PLLs 204 as compared to the number of transmit PLLs 104 in transceiver arrangement 100, because each transmit channel 221 of each transceiver 201 may still need its own frequency. As a result, high-speed clock network 205 similarly is generally not any smaller than high-speed clock network 105 in transceiver arrangement 100, although, because each transmit PLL 204 is a fractional PLL, the number of transmit PLL 204s generally would not need to be greater than the number of transmit channels 221, and could be smaller some amount of frequency re-use were certain to occur.

However, the number of input reference clocks, and therefore the number of input reference clock buffers 102, may be reduced to one, because each of the fractional transmit PLLs 204 can generate its respective frequency from the one input reference clock, which can be conducted to the fractional transmit PLLs 204 by a single-conductor clock bus 202 (or a clock bus with very few conductors, as discussed below). Single-conductor clock bus 202 can also be used to conduct the single input reference clock from single input reference clock buffer 102 to the fractional PLL 301 (FIG. 3) of each receive channel 211 of each transceiver 201.

Figure 3:
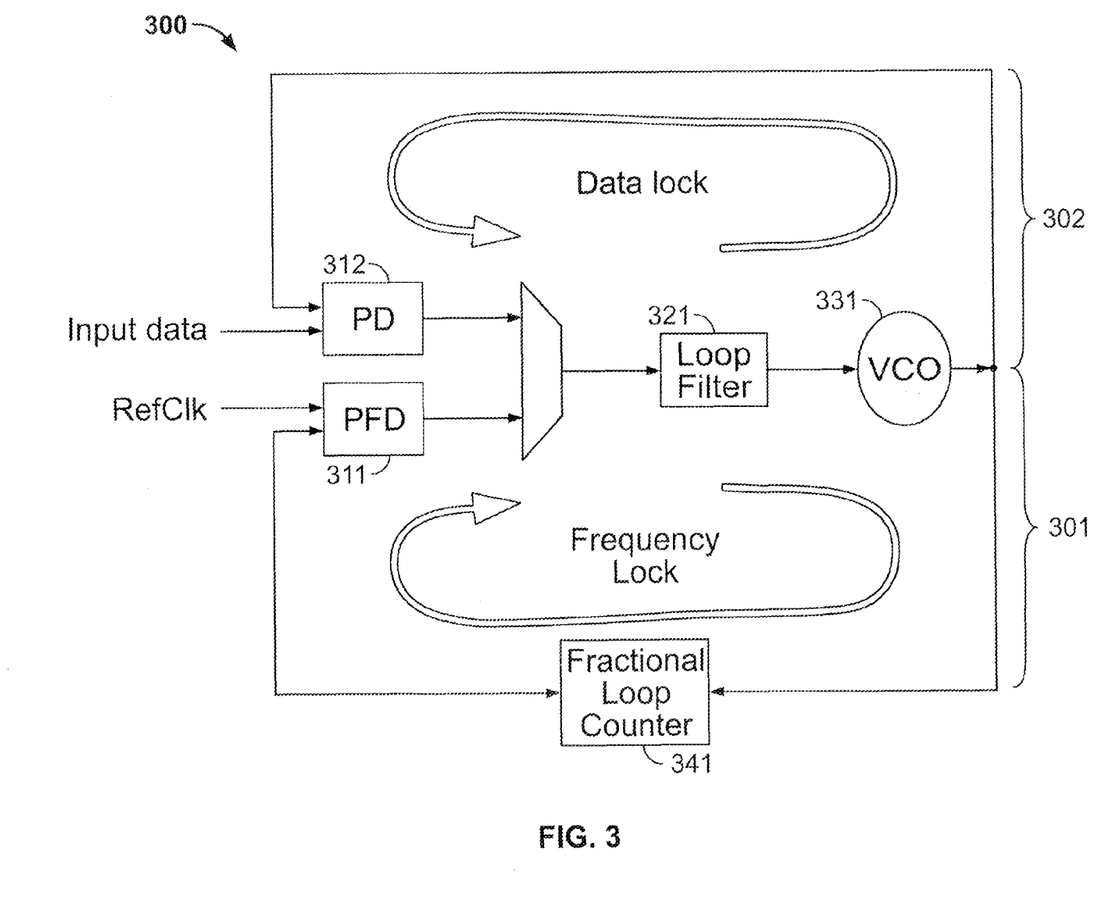
FIG. 3 shows an example of a clock-data recovery module that may be used in the arrangement of FIG. 2.

FIG. 3 shows schematically a CDR module 300 in one of receive channels 211. CDR module 300 includes a frequency-lock loop 301 and a data-lock loop 302.

Frequency-lock loop 301 is used to get close to the target frequency, using phase-frequency detector (PFD) 311, loop filter 321, voltage-controlled oscillator (VCO) 331, and fractional loop counter 341 as a fractional PLL to lock onto the target frequency based on the input of reference clock 201 and the value of fractional loop counter 341.

Once frequency-lock loop 301 gets close enough (as determined, e.g., by a lock-detect circuit (not shown), which may be conventional), data-lock loop 302 takes over, locking onto the recovered frequency using phase detector (PD) 312, loop filter 321 and VCO 331. Although fractional loop counter 341 may introduce jitter because it may operate by dithering between two integer values, that jitter does not affect the output frequency of data-lock loop 302, because fractional loop counter 341 is not used in data-lock loop 302, and the jitter is not consequential during the frequency-lock stage.

However, jitter is of concern in the transmit PLLs 104. Therefore, at least the fractional loop counters (not shown) used in transmit PLLs 104 should meet the jitter specifications of the various serial protocols that may be used. The fractional loop counters can be of analog or digital construction; however, the digital construction consumes less area and may be favored for that reason.

It should be noted that while only a single reference clock input has been shown, connected by a single conductor to the various fractional PLLs on the device, there could be multiple reference clock inputs, each of which is conducted by a respective single conductor to a respective subset of the various fractional PLLs on the device. In such an implementation, the "single" conductor may be a multi-conductor bus, with fixed connections to the target fractional PLLs. For example, there may be one reference clock input for the transmit PLLs and a separate reference clock input for the PLLs in the receiver CDR modules. Alternatively, different reference clock inputs may serve different geographic portions of the device to reduce skew and/or the power required to transmit the reference clock over the entire device.

As can be seen, by using fractional PLLS for both the transmit PLLs 104 and the CDR modules 300, reference clock network 103 can be eliminated, reducing both area and power consumption. Moreover, because a single input reference clock can be used, users are saved the effort and expense of providing multiple input reference clocks.

A PLD 140 incorporating interfaces that are clocked according to embodiments of the present invention may be used in many kinds of electronic devices. One possible use is in a data processing system 1400 shown in FIG. 4. Data processing system 1400 may include one or more of the following components: a processor 1421; memory 1422; I/O circuitry 1423; and peripheral devices 1424. These components are coupled together by a system bus 1425 and are populated on a circuit board 1426 which is contained in an end-user system 1427.

Figure 4:
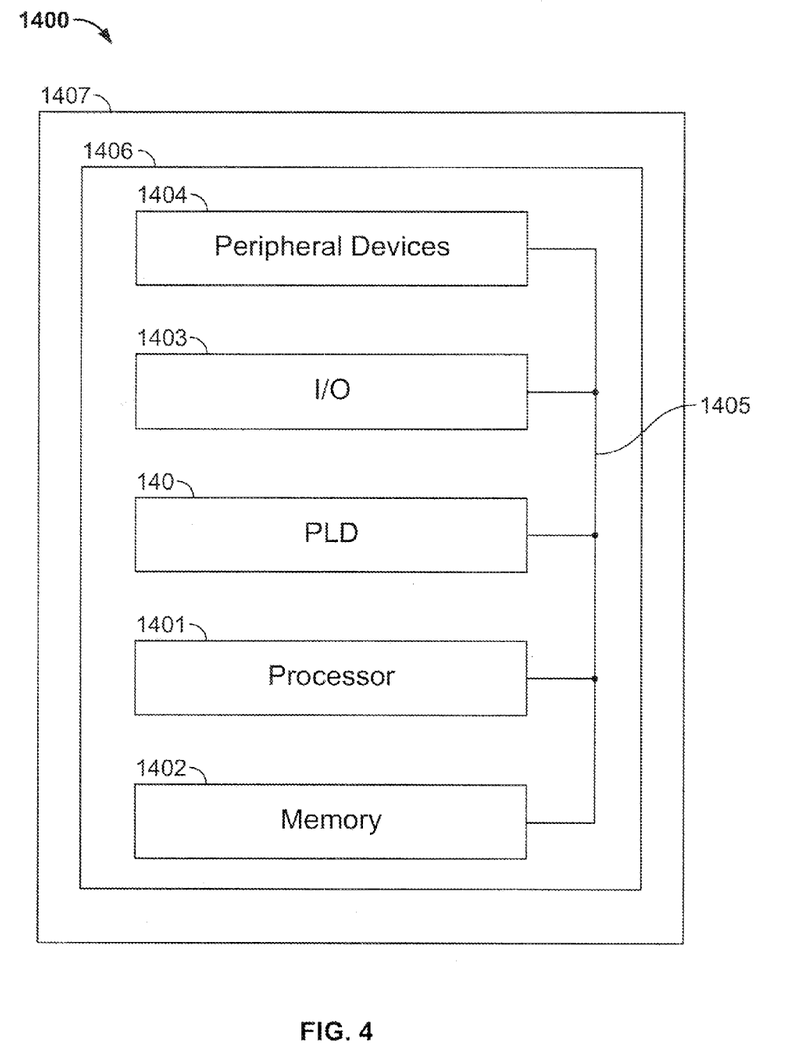
FIG. 4 shows a simplified block diagram of an illustrative system employing a programmable logic device incorporating a configurable transceiver arrangement in accordance with the present invention.

System 1420 can be used in a wide variety of applications, such as computer networking, data networking, instrumentation, video processing, digital signal processing, or any other application where the advantage of using programmable or reprogrammable logic is desirable. PLD 140 can be used to perform a variety of different logic functions. For example, PLD 140 can be configured as a processor or controller that works in cooperation with processor 1421. PLD 140 may also be used as an arbiter for arbitrating access to a shared resources in system 1400. In yet another example, PLD 140 can be configured as an interface between processor 1421 and one of the other components in system 1420. It should be noted that system 1420 is only exemplary, and that the true scope and spirit of the invention should be indicated by the following claims.

Various technologies can be used to implement PLDs 140 as described above and incorporating this invention.

Figure 5:
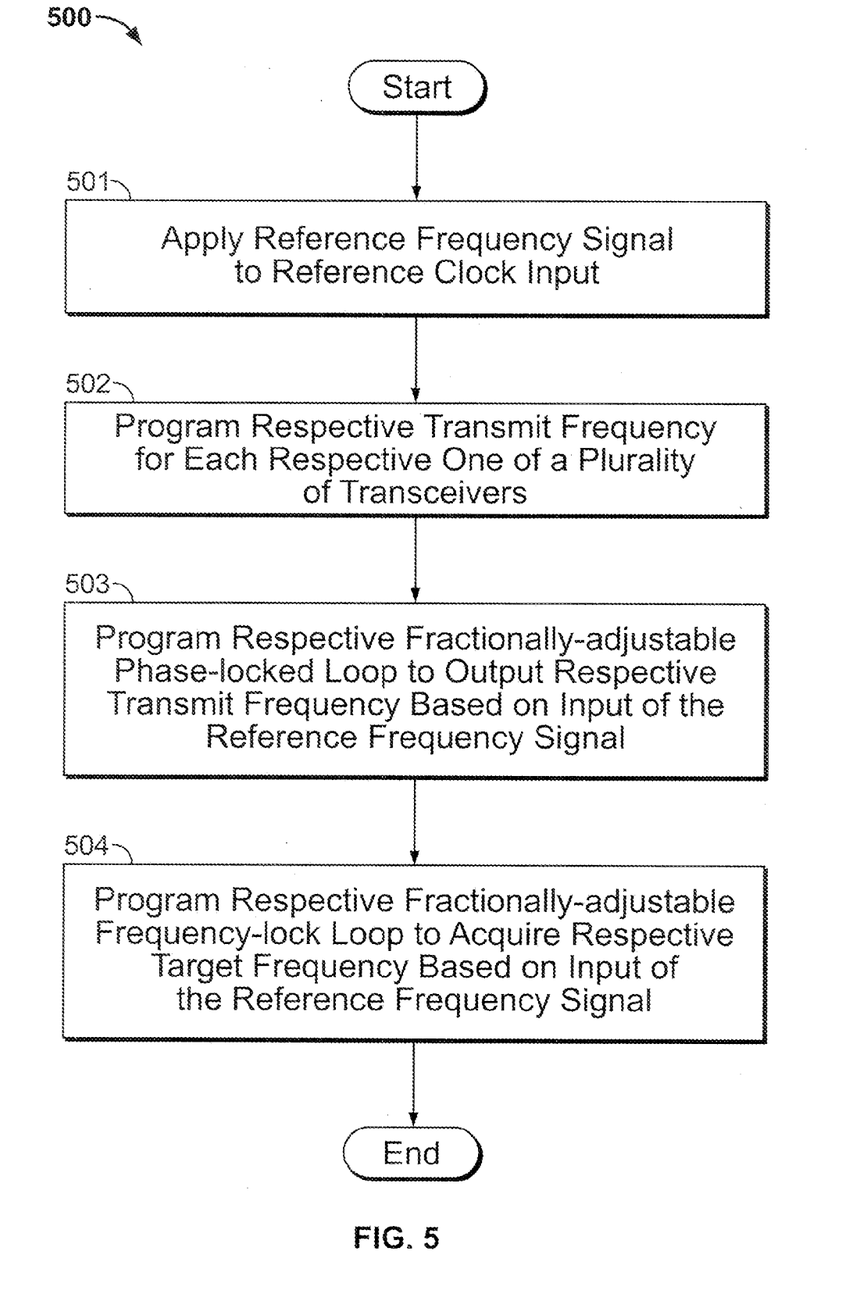
FIG. 5 shows a flow diagram of an embodiment of a method of operating a programmable logic device incorporating a configurable transceiver arrangement in accordance with the present invention.

FIG. 5 is a flow diagram of one possible embodiment 500 of a method according to the present invention for operating an integrated circuit device having a clock architecture as described above.

Method 500 begins at 501 where a reference frequency signal is applied to a reference clock input. At 502, a respective transmit frequency for each respective one of a plurality of transceivers is programmed, and at 503, respective fractionally-adjustable phase-locked loops are programmed to output respective transmit frequencies based on input of the reference frequency signal. At 504, respective fractionally adjustable frequency-lock loops are programmed to acquire respective target received frequencies based on input of the reference frequency signal.

At 501, application of a reference frequency signal to the reference clock input could include applying each of a plurality of separate reference clock inputs to one of a plurality of predetermined subsets of the adjustable phase-locked loops and the adjustable frequency-lock loops. One of the plurality of predetermined subsets of adjustable phase-locked loops and adjustable frequency-lock loops could include only adjustable phase-locked loops, and could include all of the adjustable phase-locked loops on the device. Similarly, one of the plurality of predetermined subsets of adjustable phase-locked loops and adjustable frequency-lock loops could include only adjustable frequency-lock loops, and could include all of the adjustable frequency-lock loops on the device.

It will be understood that the foregoing is only illustrative of the principles of the invention, and that various modifications can be made by those skilled in the art without departing from the scope and spirit of the invention, and the present invention is limited only by the claims that follow.

What is claimed is:

1. A clocking arrangement for transceivers in an integrated circuit device, said clocking arrangement comprising:
a plurality of fractionally adjustable phase-locked loops, each respective one of said fractionally adjustable phase-locked loops being for generating a respective transmit frequency for a respective one of said transceivers;
a respective clock-data recovery module in a receive portion of each respective one of said transceivers, each respective clock-data recovery module including a respective fractionally adjustable frequency-lock loop; and
a reference clock input providing a reference clock for said plurality of fractionally adjustable phase-locked loops and said fractionally adjustable frequency-lock loops.

2. The clocking arrangement of claim 1 wherein:
input data having a data rate is input to each respective clock-data recovery module;
said respective frequency-lock loop of said respective clock-data recovery module locks to a rate close to said data rate; and
said respective clock-data recovery module further comprises a respective data-lock loop that locks to said data rate after said respective frequency-lock loop locks to said rate close to said data rate.

3. The clocking arrangement of claim 1 wherein:
said reference clock input is a sole reference clock input that provides a reference clock for said plurality of fractionally adjustable phase-locked loops and said plurality of fractionally adjustable frequency-lock loops; and
said clocking arrangement further comprises a single reference clock conductor for conducting said reference clock from said single reference clock input to said plurality of fractionally adjustable phase-locked loops and said plurality of fractionally adjustable frequency-lock loops.

4. The clocking arrangement of claim 1 wherein:
said reference clock input comprises a plurality of separate reference clock inputs, each of which provides a separate reference clock to a first predetermined subset of said plurality of fractionally adjustable phase-locked loops and said plurality of fractionally adjustable frequency-lock loops; and said clocking arrangement further comprises a reference clock bus including a respective separate reference clock conductor for conducting each of the separate reference clocks from a respective one of said separate reference clock inputs directly to said respective predetermined subset of said plurality of fractionally adjustable phase-locked loops and said plurality of fractionally adjustable frequency-lock loops.

5. The clocking arrangement of claim 4 wherein said predetermined subset of said plurality of fractionally adjustable phase-locked loops and said plurality of fractionally adjustable frequency-lock loops comprises only adjustable phase-locked loops.

6. The clocking arrangement of claim 5 wherein said predetermined subset of said plurality of fractionally adjustable phase-locked loops and said plurality of fractionally adjustable frequency-lock loops comprises said plurality of fractionally adjustable phase-locked loops.

7. The clocking arrangement of claim 4 wherein said predetermined subset of said plurality of fractionally adjustable phase-locked loops and said plurality of fractionally adjustable frequency-lock loops comprises only adjustable frequency-lock loops.

8. The clocking arrangement of claim 7 wherein said predetermined subset of said plurality of fractionally adjustable phase-locked loops and said plurality of fractionally adjustable frequency-lock loops comprises said adjustable frequency-lock loops.

9. An integrated circuit device, comprising:
a plurality of transceivers;
a plurality of fractionally adjustable phase-locked loops, each respective one of said fractionally adjustable phase-locked loops being for generating a respective transmit frequency for a respective one of said transceivers;
a respective clock-data recovery module in a receive portion of each respective one of said transceivers, each respective clock-data recovery module including a respective fractionally adjustable frequency-lock loop; and
a reference clock input providing a reference clock for said plurality of fractionally adjustable phase-locked loops and said plurality of fractionally adjustable frequency-lock loops.

10. The integrated circuit device of claim 9 wherein:
input data having a data rate is input to each respective clock-data recovery module;
said respective frequency-lock loop of said respective clock-data recovery module locks to a rate close to said data rate; and
said respective clock-data recovery module further comprises a respective data-lock loop that locks to said data rate after said respective frequency-lock loop locks to said rate close to said data rate.

11. The integrated circuit device of claim 9 wherein:
said reference clock input is a sole reference clock input that provides a reference clock for said plurality of adjustable phase-locked loops and said plurality of adjustable frequency-lock loops; and
said clocking arrangement further comprises a single reference clock conductor for conducting said reference clock from said single reference clock input to said plurality of adjustable phase-locked loops and said plurality of adjustable frequency-lock loops.

12. The integrated circuit device of claim 9 wherein:
said reference clock input comprises a plurality of separate reference clock inputs, each of which provides a separate reference clock to a predetermined subset of said plurality of adjustable phase-locked loops and said plurality of adjustable frequency-lock loops; and
said clocking arrangement further comprises a reference clock bus including a respective separate reference clock conductor for conducting each of the separate reference clocks from a respective one of said separate reference clock inputs directly to said respective predetermined subset of said plurality of adjustable phase-locked loops and said plurality of adjustable frequency-lock loops.

13. The integrated circuit device of claim 12 wherein the predetermined subset of said plurality of adjustable phase-locked loops and said plurality of adjustable frequency-lock loops comprises only adjustable phase-locked loops.

14. The integrated circuit device of claim 13 wherein the predetermined subset of said plurality of adjustable phase-locked loops and said plurality of adjustable frequency-lock loops comprises said plurality of adjustable phase-locked loops.

15. The integrated circuit device of claim 12 wherein the predetermined subset of said plurality of adjustable phase-locked loops and said plurality of adjustable frequency-lock loops comprises only adjustable frequency-lock loops.

16. The integrated circuit device of claim 15 wherein the predetermined subset of said plurality of adjustable phase-locked loops and said plurality of adjustable frequency-lock loops comprises said plurality of adjustable frequency-lock loops.

17. The integrated circuit device of claim 9, wherein said integrated circuit device is programmable.

18. The integrated circuit device of claim 17, wherein said integrated circuit device is a programmable logic device.

19. A method of operating a programmable integrated circuit device having a plurality of transceivers, a plurality of fractionally adjustable phase-locked loops, and a respective clock-data recovery module in a receive portion of each respective one of said transceivers, each respective clock-data recovery module including a respective fractionally adjustable frequency-lock loop, and a reference clock conductor connected to said plurality of fractionally adjustable phase-locked loops and to each respective one of said plurality of fractionally adjustable frequency-lock loops, said method comprising:
applying a reference frequency signal to said reference clock conductor;
programming a respective transmit frequency for each respective one of a plurality of said transceivers;
programming a respective one of said plurality of fractionally adjustable phase-locked loops to output one said respective transmit frequency based on input of said reference frequency signal; and
programming each respective one of said plurality of fractionally adjustable frequency-lock loops to acquire a target received frequency based on input of said reference frequency signal.

20. The method of claim 19 wherein each respective clock-data recovery module further includes a respective data-lock loop, said method further comprising:
applying input data having a data rate to each respective clock-data recovery module, said target received frequency being close to said data rate; and programming each respective data-lock loop to lock to said data rate after said respective frequency-lock loop locks to said target received frequency.

21. The method of claim 19 wherein:
said applying a reference frequency signal to said reference clock conductor comprises applying each of a plurality of separate reference clock inputs to one of a plurality of predetermined subsets of said plurality of adjustable phase-locked loops and said plurality of adjustable frequency-lock loops.

22. The method of claim 21 wherein one of the plurality of predetermined subsets of said plurality of adjustable phase-locked loops and said plurality of adjustable frequency-lock loops comprises only adjustable phase-locked loops.

23. The method of claim 22 wherein the one of the plurality of predetermined subsets of said plurality of adjustable phase-locked loops and said plurality of adjustable frequency-lock loops comprises said plurality of adjustable phase-locked loops.

24. The method of claim 21 wherein one of the plurality of predetermined subsets of said plurality of adjustable phase-locked loops and said plurality of adjustable frequency-lock loops comprises only adjustable frequency-lock loops.

25. The method of claim 24 wherein the one of the plurality of predetermined subsets of said plurality of adjustable phase-locked loops and said plurality of adjustable frequency-lock loops comprises said plurality of adjustable frequency-lock loops.

* * * * *